United States Patent
Calö et al.

(10) Patent No.: US 7,626,456 B2
(45) Date of Patent: Dec. 1, 2009

(54) OVERDRIVE CONTROL SYSTEM

(75) Inventors: Pietro Antonio Paolo Calö, Laterza (IT); Philippe Sirito-Olivier, Carro Par Martigues (FR); Mario Chiricosta, Messina (IT)

(73) Assignees: STMicroelectronics SA, Montrouge (FR); STMicroelectronics S.R.L., Agrate Brianza (MI) (IT)

( * ) Notice: Subject to any disclaimer, the term of this patent is extended or adjusted under 35 U.S.C. 154(b) by 41 days.

(21) Appl. No.: 12/121,143

(22) Filed: May 15, 2008

(65) Prior Publication Data
US 2008/0284518 A1 Nov. 20, 2008

(30) Foreign Application Priority Data
May 18, 2007 (EP) .................. 07290646

(51) Int. Cl.
*H03F 21/00* (2006.01)
(52) U.S. Cl. .................. 330/207 P; 330/310
(58) Field of Classification Search .............. 330/207 P, 330/298, 310, 150, 98
See application file for complete search history.

(56) References Cited

U.S. PATENT DOCUMENTS

| | | | |
|---|---|---|---|
| 4,050,086 A * | 9/1977 | Harr .......................... 360/66 |
| 4,816,963 A * | 3/1989 | Eden .......................... 361/101 |
| 6,774,726 B2 * | 8/2004 | Goutti et al. ................. 330/298 |
| 6,806,771 B1 | 10/2004 | Hildebrant et al. .......... 330/284 |
| 6,914,485 B1 | 7/2005 | Carroll ........................ 330/258 |
| 7,253,680 B2 * | 8/2007 | Laletin ........................ 330/69 |
| 7,295,067 B2 * | 11/2007 | Kamakura et al. .......... 330/253 |
| 2006/0012405 A1 | 1/2006 | Martins ....................... 327/77 |

* cited by examiner

*Primary Examiner*—Henry K Choe
(74) *Attorney, Agent, or Firm*—Lisa K. Jorgenson; Allen, Dyer, Doppelt, Milbrath & Gilchrist, P.A.

(57) ABSTRACT

An overdrive control system includes a voltage controlled current source to deliver a compensation current, and being between a first voltage reference and an internal node, which is connected to an output terminal. The voltage controlled current source has a control terminal connected to an output terminal of an adding block, which has a positive input connected to an input terminal. At least one clamping block is between the output terminal and a second voltage reference, and is connected to a negative input of the adding block. The voltage controlled current source delivers its compensation current to the output terminal when a voltage signal on the input terminal has an higher value than a voltage signal on the output terminal, and forces an output voltage signal to follow an input voltage signal to an extent that depends on a clamping voltage provided by the clamping block.

24 Claims, 4 Drawing Sheets

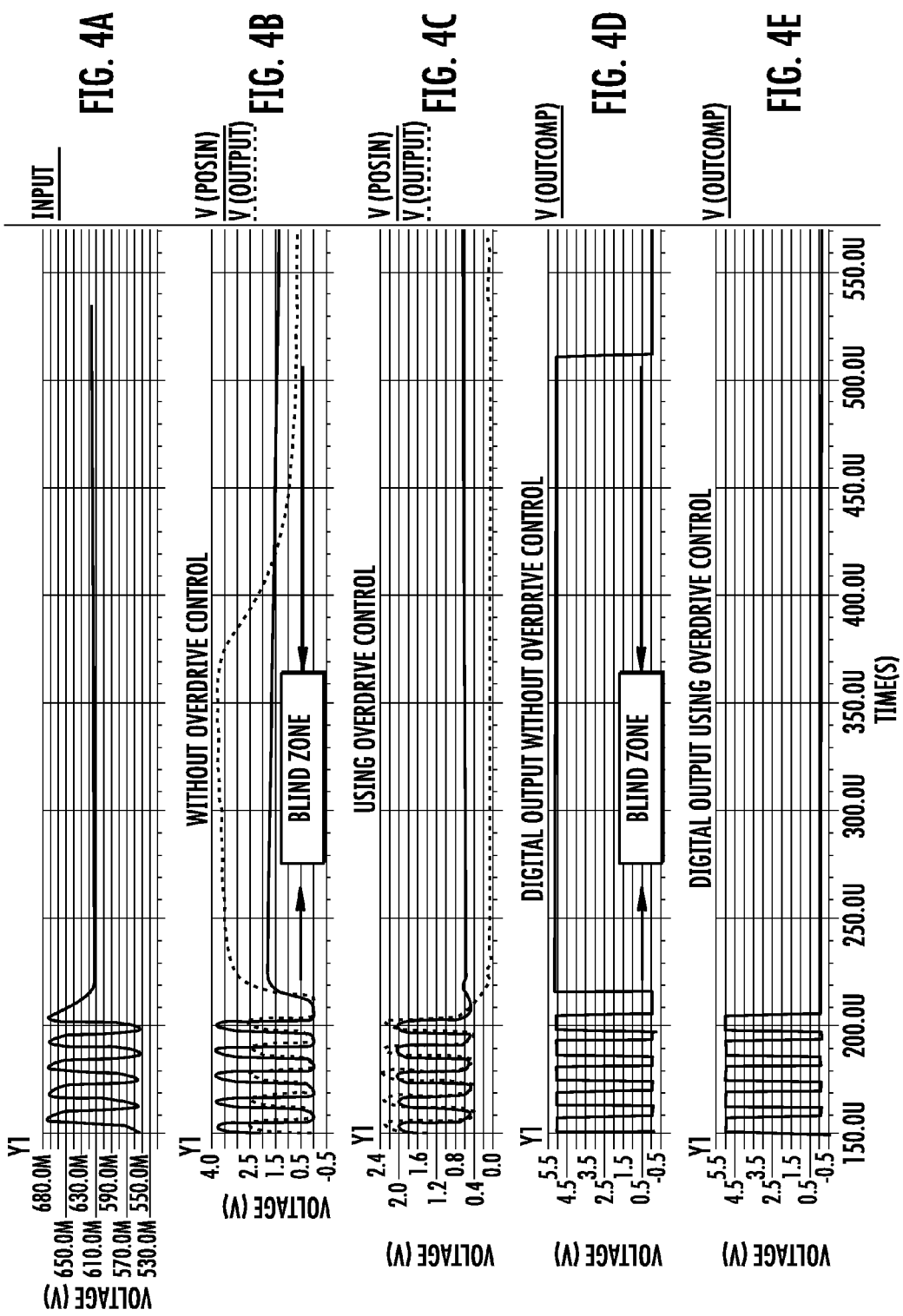

US 7,626,456 B2

OVERDRIVE CONTROL SYSTEM

FIELD OF THE INVENTION

The present invention relates to an overdrive control system, particularly for fixed gain amplifiers. More specifically, the invention relates to an overdrive control system between a first and a second voltage reference and having an input terminal and an output terminal, respectively connected to a first and second input terminal of an amplification stage. The invention more particularly, but not exclusively, relates to an overdrive control system for a two-stage amplifier and the following description is made with reference to this field of application for convenience of explanation.

BACKGROUND OF THE INVENTION

For modern communication system based on infrared-light transmission, signal conditioning with minimum data loss is a major specification. This signal conditioning may also become an issue in many cases when input light pulses with extended amplitude range may be converted to a current or voltage signal and then amplified by a fixed gain. In fact, the minimum detectable signal itself fixes the gain but also determines the maximum amplitude of an input signal before an amplifier is pushed into deep non-linear operation and saturation.

A realization of a limiting network to be used in these cases simply comprises two Schottky diodes and a current limiting resistor. Such a limiting network is intended to avoid deep saturations in sensible parts of a protected circuit. It employs an input limiting mechanism to force a required output voltage. Otherwise, a direct output limiting mechanism is used. In these cases the protection of the circuit is activated in case of a fault, as well as in case of an unforeseen operating condition, and it prevents damages to the circuit itself.

Such a protected circuit cannot operate correctly (no linear conditions being provided) as long as the limiting network is functional. Nevertheless, a clamped overdrive recovery time should be at least an order of magnitude faster than the amplifier's normal saturation recovery time, thus allowing rapid resumption of linear operation.

In particular, in digital communication systems dealing with the so called OOK [On-Off Keying] data type, a receiver output stage is pushed to the edge of saturation by normal input drive conditions so as to swing between rails. When an overdrive occurs, the saturation of the output stage becomes an issue because, depending on an overdrive level, it may be pushed far beyond the saturation edge, thus leading to light pulse misdetection and fault in the communication.

The saturation level is usually controlled by using a control loop that acts on the gain of the receiver, adjusting it according to necessity. Such an approach may not be applied when an open loop amplification chain is to be used.

Moreover, the known approaches cannot always correctly operate in case of an amplifier input signal having a wide range, and little data loss may not be guaranteed at higher levels of such an input signal. The technical issue underlying the approach presented in the present application is that of providing an overdrive control system having structural and functional characteristics which allow the widening of the amplifier input range without deep changes in the amplifier architecture, and to help reduce data loss at higher levels of the amplifier input signal, in this way overcoming the limits which still affect the devices realized according to the prior art.

SUMMARY OF THE INVENTION

The present approach is that of providing a clamping mechanism for the input and output terminals of an amplification stage, the clamping, depending on the amplitude of an input signal applied to such input terminals, in order to allow a fast recovery from a deep saturation condition on the output an amplifier comprising an amplification stage, and to avoid a generation of spurious pulses on an output terminal of the amplification stage after an overdrive condition has passed.

The characteristics and advantages of the overdrive control system according to this approach will be apparent from the following description of an embodiment thereof given by way of indicative and non limiting example with reference to the annexed drawings.

BRIEF DESCRIPTION OF THE DRAWINGS

FIGS. 4A-4E schematically show the pattern of internal signals of a two-stage voltage amplifier which comprises respectively the overdrive control system, according to the invention.

DETAILED DESCRIPTION OF THE PREFERRED EMBODIMENTS

Figure 1:
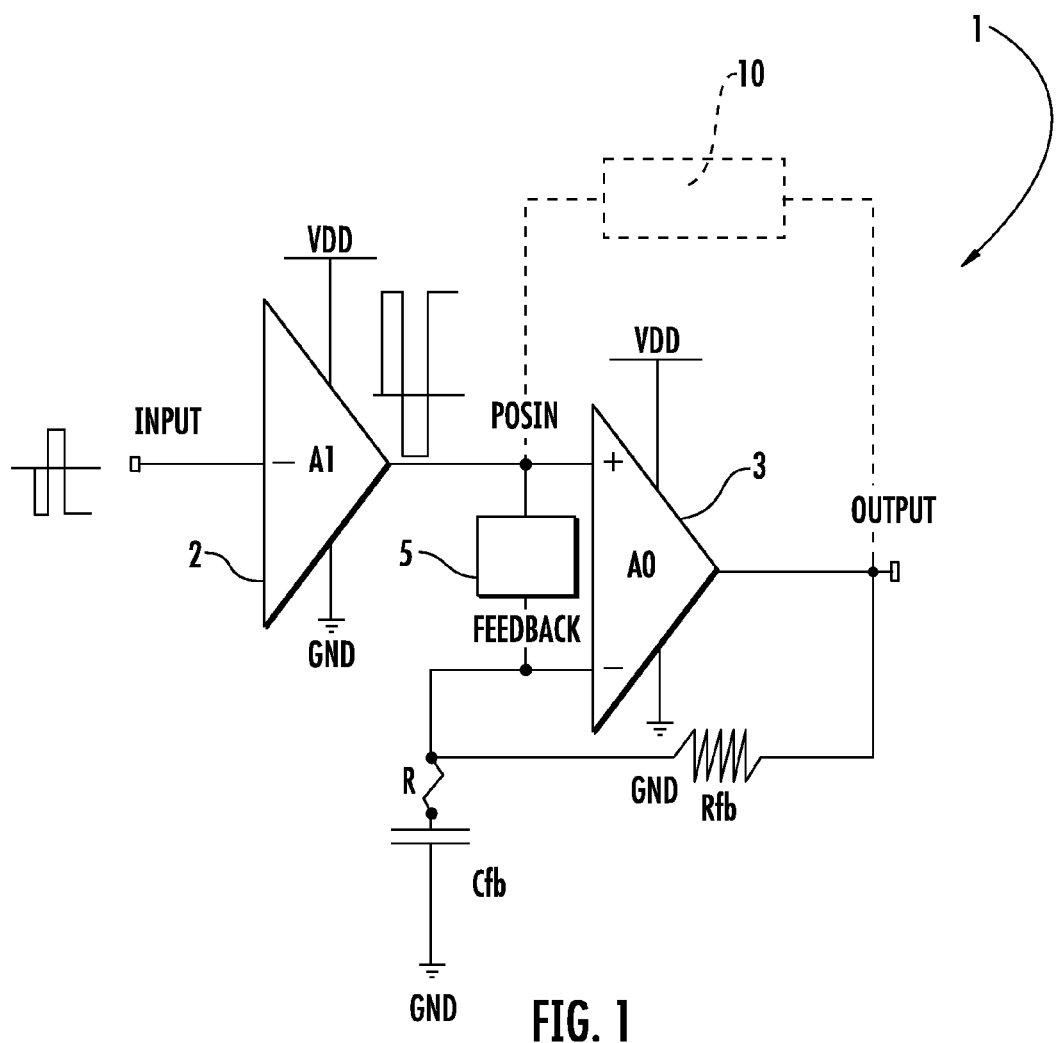
FIG. 1 schematically shows a two-stage voltage amplifier comprising an overdrive control system, according to the invention.

With reference to such figures, and in particular to FIG. 1, a two-stage voltage amplifier is shown by way of example, globally and schematically indicated with 1.

The two-stage voltage amplifier 1 is between a first voltage reference, in particular a supply voltage reference VDD and a second voltage reference, in particular a ground GND, and has an input terminal INPUT and an output terminal OUTPUT. More particularly, the two-stage voltage amplifier 1 comprises a first or input amplification stage 2, and a second or output amplification stage 3, between the supply voltage reference VDD and ground GND, and connected, in cascade to each other, between the input and output terminals, INPUT and OUTPUT.

The input amplification stage 2 has an input terminal, in particular an inverting one (−), connected to the input terminal INPUT of the two-stage voltage amplifier 1 and receiving therefrom an input signal. The input amplification stage 2 also has an output terminal connected to a first input terminal, in particular a non-inverting one (+), indicated as POSIN, of the output amplification stage 3. The output amplification stage has a second input terminal, in particular an inverting one (−), indicated as FEEDBACK, connected to ground GND through the series of a biasing resistor R and a feedback capacitor $C_{fb}$.

The output amplification stage 3 also has an output terminal connected to the output terminal OUTPUT of the two-stage voltage amplifier 1 and, in a feedback loop, to its second input terminal FEEDBACK by means of a feedback resistor Rfb.

The two-stage voltage amplifier 1 also comprises an overdrive control system 5, connected between the input terminals POSIN and FEEDBACK of the output amplification stage 3.

It should be noted that the following description of a two-stage amplifier should not be intended in a limitative way, being given only as an example, the same considerations applying in case of an-stage amplifier, the output amplification stage 3 being the n-th stage of such an amplifier.

Figure 2A:
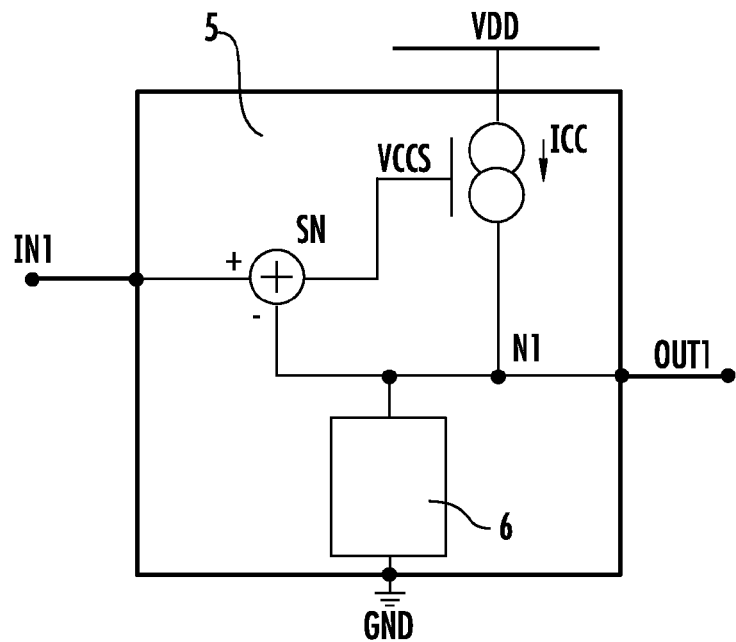
FIG. 2A schematically shows the overdrive control system, according to the invention.

An overdrive control system is schematically shown in FIG. 2A, globally indicated with 5. The overdrive control system 5 is inserted between the supply voltage reference VDD and ground GND, and has an input terminal IN1 and an output terminal OUT1, respectively connected to the nodes POSIN and FEEDBACK of the output amplification stage 3.

More particularly, the overdrive control system 5 comprises a voltage controlled current source VCCS, delivering a compensation current ICC and being inserted between the supply voltage reference VDD and an internal node N1, which is in turn connected to the output terminal OUT1. The voltage controlled current source VCCS has a control terminal connected to an output terminal of an adding block SN, which in turn has a positive input connected to the input terminal IN1. Moreover, the overdrive control system 5 comprises a clamping block 6, between the output terminal OUT1 and ground GND, and connected to a negative input of the adding block SN.

In this way, when a voltage signal on the input terminal IN1 has an higher value than a voltage signal on the output terminal OUT1, the voltage controlled current source VCCS delivers its compensation current ICC to such an output terminal OUT1, thus forcing the output voltage signal to follow the input one to an extent that depends on a clamping voltage Vcl provided by the clamping block 6. Moreover, when this clamping block 6 is on, it sinks a current until the input voltage signal goes down beyond a clamping point defined by the clamping voltage Vcl.

Figure 3A:
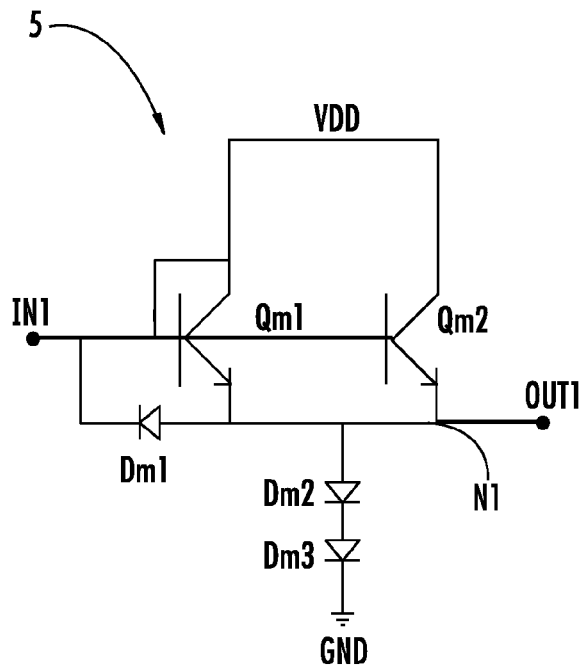
FIGS. 3A and 3B schematically show respective circuital implementations of the overdrive control system and of its further portion of FIGS. 2A and 2B.

FIG. 3A shows a preferred circuital implementation of the overdrive control system 5 according to the first embodiment of FIG. 2A. In particular, the overdrive control system 5 comprises an input transistor Qm1, in particular a bipolar one, between the supply voltage reference VDD and the internal node N1, and having a control or base terminal connected to its collector terminal and to the input terminal IN1 of the overdrive control system 5. The overdrive control system 5 also comprises an output transistor Qm2, in particular a bipolar one, inserted between the supply voltage reference VDD and the output terminal OUT1, which is in turn connected to the internal node N1, the output bipolar transistor Qm2 having its control or base terminal connected to the control terminal of the input terminal transistor Qm1.

The overdrive control system 5 further comprises a first clamping diode Dm1 between the input terminal IN1 and the internal node N1, as well as second and third clamping diodes, Dm2 and Dm3, in series to each other, between the internal node N1 and ground GND.

The overdrive control system 5 between the nodes POSIN and FEEDBACK of the output amplification stage 3, is shown in FIG. 1. When a strong pulse is applied to the input terminal INPUT, a voltage value on the node POSIN—during a rising edge of this pulse—is softly clamped to a voltage value equal to one diode voltage over its DC value, thanks to the first clamping diode Dm1.

Moreover, the output terminal OUT1 of the overdrive control system 5, and thus the node FEEDBACK connected thereto, is charged through the input and output transistors, Qm1 and Qm2, and its voltage value follows the voltage value on the node POSIN before getting clamped to a voltage value equal to two diode voltages, thanks to the second and third diodes, Dm2, Dm3. In this way, the loop of the output amplification stage 3 is opened, the voltage difference through the nodes POSIN and FEEDBACK being however clamped to a voltage value equal to one diode voltage.

In essence, making reference to the block scheme of FIG. 2A, the input transistor Qm1 realizes the voltage controlled current source VCCS, its base and emitter terminals having the function of the adding block SN, while the second and third diodes Dm2 and Dm3 realize the clamping block 6.

Figure 2B:
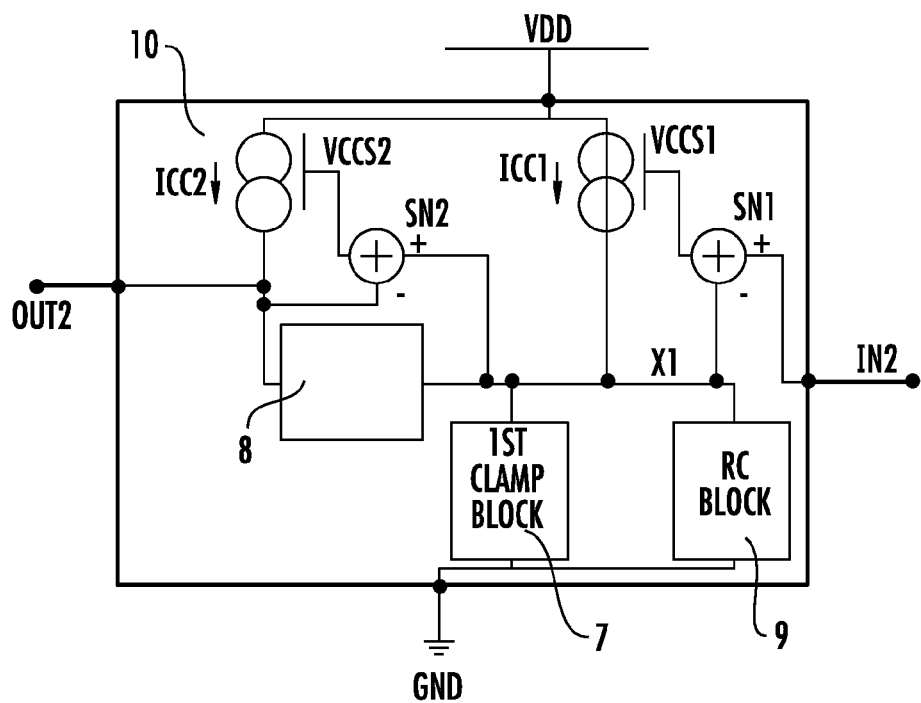
FIG. 2B schematically shows a further portion of the overdrive control system, according to the invention.

It should be noted that the correct operation of the overdrive control system, as shown in FIGS. 2A and 3A, is likely if the voltage signal on the node POSIN is reasonably a small signal. In this case, the voltage signal on the terminal OUTPUT is an amplified replica of the voltage signal on the node POSIN. When this small signal condition is not met, the overdrive control system 5 further comprises an additional clamping circuit, schematically shown in FIG. 2B and globally indicated with 10.

The additional clamping circuit 10 is between the supply voltage reference VDD and ground GND and has an input terminal IN2 and an output terminal OUT2, respectively connected to the nodes OUTPUT and POSIN of the output amplification stage 3, as shown in FIG. 1. More particularly, the additional clamping circuit 10 comprises a first voltage controlled current source VCCS1, delivering a first compensation current ICC1 and being inserted between the supply voltage reference VDD and a reference node X1. The first voltage controlled current source VCCS1 has a control terminal connected to the output terminal of a first adding block SN1, which in turn has a positive input connected to the input terminal IN2, and a negative input connected to the reference node X1.

The additional clamping circuit 10 further comprises a second voltage controlled current source VCCS2 delivering a second compensation current ICC2 and being between the supply voltage reference VDD and the output terminal OUT2. The additional voltage controlled current source VCCS2 has a control terminal connected to an output terminal of a second adding block SN2, which in turn has a positive input connected to the reference node X1.

Moreover, the additional clamping circuit 10 comprises a first clamping block 7, between the reference node X1 and ground GND, and a second clamping block 8 between the reference node X1 and the output terminal OUT, which is in turn connected to a negative input of the second adding block SN2. Finally, the additional clamping circuit 10 comprises an RC block 9, in particular an RC network, between the reference node X1 and ground GND.

In this way, the second voltage controlled current source VCCS2 delivers its second compensation current ICC2 into the RC block 9 so as to raise a voltage signal on the reference node X1 to a value which will be no higher than a first clamping voltage Vcl1 of the first clamping block 7. When the voltage signal on the output terminal OUT2 goes suddenly down—reaching a value which is higher than a second clamping voltage Vcl2 of the second clamping block 8—the second voltage controlled current source VCCS2 is enabled to deliver its second compensation current ICC2. In fact, the reference node X1 has a voltage value retained by an RC time constant due to the RC block 9.

Figure 3B:
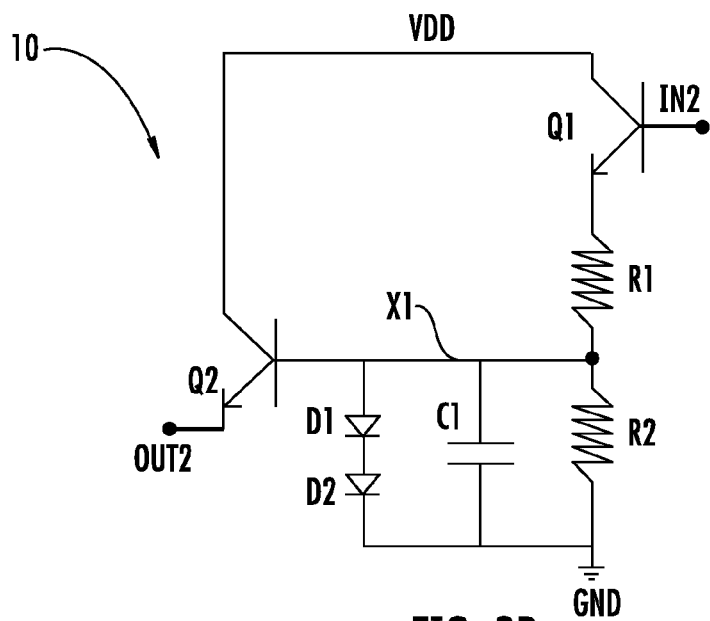

The second compensation current ICC2 of the second voltage controlled current source VCCS2 flows through the output terminal OUT2, thus helping the output voltage signal to slow down its fall. FIG. 3B shows a preferred circuital implementation of the additional clamping circuit 10 of FIG. 2B.

In particular, the additional clamping circuit 10 comprises an input transistor Q1 and an input resistor R1, in series to each other, between the supply voltage reference VDD and the reference node X1, the input transistor Q1 having the control or base terminal connected to the input terminal IN2 of the additional clamping circuit 10.

Moreover, the additional clamping circuit 10 comprises an output transistor Q2 between the supply voltage reference VDD and the output terminal OUT2 and having its control or base terminal connected to the reference node X1. The additional clamping circuit 10 also comprises first and second clamping diodes, D1 and D2, inserted, in series to each other, between the reference node X1 and ground GND, as well as a resistor R and a capacitor C1, in parallel to each other, between the reference node X1 and ground GND.

In this way, in case of an opening of the loop connected to the output terminal OUTPUT of the two-stage voltage amplifier 1, also in small signal condition, the rapid raising of this node to the value of the supply voltage reference VDD is reduced thanks to the additional clamping circuit 10. In particular, it should be noted that the reference node X1 of the additional clamping circuit 10 acts as a voltage reference.

The capacitor C1 connected to this reference node X1 is charged by the voltage signal on the input terminal IN2—connected to the output terminal OUTPUT of the two-stage voltage amplifier 1—and is further slightly discharged across the resistor R2. In other words, the reference node X1 may not go beyond a voltage value equal to two diode voltages due to the clamping realized by the clamping diodes D1 and D2.

In this way, the voltage signal on the output terminal OUT2—connected to the node POSIN—during a falling edge, goes down more rapidly than the reference node X1 discharging, so as to open the output transistor Q2 and to get a voltage value equal to one diode voltage clamped below the reference node X1, due to the clamping effect of the capacitor C1. In essence, the input transistor Q1 realizes the first voltage controlled current source VCCS1, its base and emitter terminals having the function of the first adding block SN1, while the output transistor Q2 realizes the second voltage controlled current source VCCS2, its base and emitter terminals having the function of the second adding block SN2. Moreover, the clamping diodes, D1 and D2, the capacitor C1, and the resistor R2 form the clamping blocks 7, 8.

In other words, the additional clamping circuit 10 provides for a non-linear feedback between the nodes POSIN and OUTPUT of the output amplification stage 3, and also prevents a deep saturation of the node POSIN (being connected to the output terminal of the input amplification stage 2), keeping it slightly below its DC value for the effect of the clamping mechanism realized by the additional clamping circuit 10, as above explained.

The results of simulations carried out by the Applicant are shown in FIGS. 4A-4E. In particular, FIG. 4A shows a pattern of an input signal applied to the input terminal INPUT of a two-stage voltage amplifier 1.

FIGS. 4C and 4B show the patterns of the voltage signal on the node POSIN (continuous line) and the output signal issued by the output terminal OUTPUT (dotted line) of the two-stage voltage amplifier 1, when a overdrive control system 5 is used or not, respectively. FIGS. 4E and 4D are the digitized version of the input pulses after amplification on the output of a final comparator (not reported in FIG. 1) when a overdrive control system 5 is used or not, respectively.

It is thus immediately evident that the two-stage voltage amplifier 1, comprising the overdrive control system 5, reconstructs the input pulses on the output terminal of a final comparator of the two-stage voltage amplifier 1, while if using prior art approaches without the overdrive control system 5, a blind zone (shown in FIGS. 4B and 4D) of incorrect operation of the amplifier would be found.

Although the use of bipolar transistors Qm1, Qm2, Q1, Q2 has been described herein, those of skill in the art will appreciate that field effect transistors (FETS) may also be used. Furthermore, combinations of bipolar transistors and FETS may be used.

In essence, the proposed overdrive control overcomes the drawbacks affecting the prior art and provides several advantages. In particular, the overdrive control system 5 allows a fast recovery from a deep saturation condition, and avoids the generation of spurious pulses on the output of the two-stage voltage amplifier 1 after an overdrive condition has passed.

As an immediate consequence, a dynamic range of operation of the input signal is enhanced. In a more general way, the two-stage voltage amplifier 1 comprising a overdrive control system 5 realizes, in a simple way, an adaptive gain amplifier.

That which is claimed is:

1. An overdrive control system to be coupled between first and second reference voltages and to an amplification stage having a first input, a second input, and an output, the overdrive control system comprising:

an input terminal and an output terminal to be coupled respectively to the first and second inputs of the amplification stage;

an internal node coupled to said output terminal;

a voltage controlled current source having a control terminal and to be coupled between the first reference voltage and said internal, node;

an adding block having first and second inputs and an output, said first input of said adding block coupled to said input terminal, said output of said adding block being coupled to said control terminal of said voltage controlled current source; and at least one clamping block to be coupled between said output terminal and the second reference voltage, and coupled to said second input of said adding block;

said voltage controlled current source to deliver a compensation current to said output terminal when a voltage signal on said input terminal has a value greater than a voltage signal on said output terminal to thereby force the voltage signal on the output terminal to follow the voltage signal on the input terminal by an amount based upon a clamping voltage provided by said at least one clamping block.

2. The overdrive control system according to claim 1, wherein said voltage controlled current source comprises an input transistor having a conduction terminal to be coupled to the first reference voltage, a conduction terminal coupled to said internal node, and a control terminal coupled to said input terminal; and further comprising an output transistor having a conduction terminal to be coupled to the first reference voltage, a conduction terminal coupled to said internal node, and a control terminal coupled to said control terminal of said input transistor.

3. The overdrive control system according to claim 2, further comprising a first clamping diode coupled to said input terminal and said internal node.

4. The overdrive control system according to claim 3, wherein said at least one clamping block comprises second and third clamping diodes to be coupled in series with each other and between said internal node and the second reference voltage.

5. The overdrive control system according to claim 4, further comprising an additional clamping circuit to be coupled between said first and second reference voltages, having an input coupled to said output terminal and an output to be coupled to the first input of the amplification stage.

6. The overdrive control system according to claim 5, wherein said additional clamping circuit comprises:
a reference node;
a first voltage controlled current source having a control terminal and to be coupled to the first reference voltage and said reference node;
a first adding block having an output coupled to said control terminal of said first voltage controlled current source, a first input coupled to said input, and a second input coupled to said reference node;
a second voltage controlled current source having a control terminal and to be coupled to said fist reference voltage and said output of said additional clamping circuit; and
a second adding block having an output coupled to said control terminal of said second voltage controlled current source, a first input coupled to said reference node, and a second input.

7. The overdrive control system according to claim 6, wherein said additional clamping circuit further comprises a first clamping block to be coupled to said reference node and the second reference voltage, and a second clamping block coupled to said reference node and said output of said additional clamping circuit; and wherein said output of said additional clamping circuit is coupled to said second input of said second adding block.

8. The overdrive control system according to claim 7, wherein said additional clamping circuit further comprises an RC block to be coupled to said reference node and the second reference voltage; wherein said second voltage controlled current source is to deliver its second compensation current to said RC block to raise a voltage of said reference node to a value not higher than a first clamping voltage of said first clamping block, said second voltage controlled current source to deliver the second compensation current when a voltage signal on said output of said additional clamping circuit drops to a value within a threshold of a second clamping voltage of said second clamping block; and wherein said reference node has a voltage value retained by a time constant due to said RC block.

9. The overdrive control system according to claim 8, wherein said first voltage controlled current source comprises an input transistor and an input resistor to be coupled in series with each other and between the first reference voltage and said reference node, said input transistor having a control terminal coupled to said input of said additional clamping circuit.

10. The overdrive control system according to claim 9, wherein said second voltage controlled current source comprises an output transistor to be coupled to the first reference voltage and said output, said output transistor having a control terminal coupled to said reference node.

11. The overdrive control system according to claim 10, wherein said additional clamping circuit further comprises first and second clamping diodes to be coupled in series with each other and between said reference node and the second reference voltage.

12. The overdrive control system according to claim 11, wherein said first and second clamping blocks comprise a resistor and a capacitor, to be coupled in parallel with each other and between said reference node and the second reference voltage, said capacitor to be charged by a voltage signal on said input of said additional clamping circuit and to be discharged across said resistor.

13. The overdrive control system according to claim 1, wherein said voltage controlled current source, said adding block, and said at least one clamping block are coupled to said amplification stage to define an adaptive gain amplifier.

14. A voltage amplifier to be coupled to first and second reference voltages and having an input terminal and an output terminal, the voltage amplifier comprising:
first and a second amplification stages to be coupled between the first and second reference voltages and coupled, in cascade to each other, between the input and output terminals of the voltage amplifier;
a biasing resistor and a feedback capacitor coupled in series with each other to couple said second input of said second amplification stage to the second reference voltage;
said second amplification stage having a first input, a second input, and an output;
said first amplification stage having an output coupled to said first input of said second amplification stage;
a feedback resistor coupled between said second input terminal and said output of said second amplification stage;
the output of said second amplification stage coupled to the output terminal of the voltage amplifier; and
an overdrive control system coupled to said first and second input terminals of said second amplification stage and comprising
an input terminal and an output terminal coupled respectively to said first and second inputs of said second amplification stage,
an internal node coupled to said output terminal of said overdrive control system,
a voltage controlled current source having a control terminal and to be coupled between the first reference voltage and said internal node,
an adding block having first and second inputs and an output, said first input of said adding block being coupled to said input terminal of said overdrive control system, said output of said adding block being coupled to said control terminal of said voltage controlled current source, and
at least one clamping block to be coupled between said output terminal of said overdrive control system and the second reference voltage, and to said second input of said adding block,
said voltage controlled current source to deliver a compensation current to said output terminal of said overdrive control system when a voltage signal on said input terminal has a value greater than a voltage signal on said output terminal of said overdrive control system to thereby force the voltage signal on said output of said overdrive control system to follow the voltage signal on said input of said overdrive control system by an amount based upon a clamping voltage provided by said at least one clamping block.

15. The voltage amplifier of claim 14, wherein said voltage controlled current source of said overdrive control system comprises an input transistor having a conduction terminal to be coupled to the first reference voltage, a conduction terminal coupled to said internal node, and a control terminal coupled to said input terminal of said overdrive control system; and wherein said overdrive control system further comprises an output transistor having a conduction terminal to be coupled to the first reference voltage, a conduction terminal coupled to said internal node, and a control terminal coupled to said control terminal of said input transistor.

16. The voltage amplifier of claim 15, wherein said overdrive control system further comprises a first clamping diode coupled to said input terminal of said overdrive control system and said internal node.

17. The voltage amplifier of claim 16, wherein said at least one clamping block of said overdrive control system comprises second and third clamping diodes to be coupled in series with each other and between said internal node and the second reference voltage.

18. A method of making an overdrive control system to be coupled to first and second reference voltages and to an amplification stage having a first input, a second input, and an output, the method comprising:
    providing an input terminal and an output terminal to be respectively coupled to the first and second inputs of the amplification stage;
    coupling an internal node to the output terminal;
    providing a voltage controlled current source to be coupled between the first reference voltage and the internal node;
    coupling a first input of an adding block to the input terminal;
    coupling a control terminal of the voltage controlled current source to an output of the adding block; and
    providing at least one clamping block to be coupled between the output terminal and the second reference voltage, and to be coupled to the second input of the adding block;
    the voltage controlled current source to deliver a compensation current to the output terminal when a voltage signal on the input terminal has a value greater than a voltage signal on the output terminal to thereby force the output voltage signal to follow the input voltage signal by an amount based upon a clamping voltage provided by the at least one clamping block.

19. The method according to claim 18, wherein the voltage controlled current source comprises an input transistor having a conduction terminal to be coupled to the first reference voltage, a conduction terminal coupled to the internal node, and a control terminal coupled to the input terminal; and further comprising providing a conduction terminal of an output transistor to be coupled to the first reference voltage, coupling a conduction terminal of the output transistor to the internal node, and coupling a control terminal to the control terminal of the input transistor.

20. The method according to claim 19, further comprising coupling a first clamping diode to the input terminal and the internal node.

21. The method according to claim 20, wherein the at least one clamping block comprises second and third clamping diodes to be coupled in series with each other and between the internal node and the second reference voltage.

22. The method according to claim 21, further comprising providing an additional clamping circuit to be coupled between the first and second reference voltages, and respectively coupling an input and an output of the additional clamping circuit to the output terminal and the first input of the amplification stage.

23. The method according to claim 22, wherein the additional clamping circuit comprises:
    a reference node;
    a first voltage controlled current source having a control terminal and to be coupled to the first reference voltage and the reference node;
    a first adding block having an output coupled to the control terminal of the first voltage controlled current source, a first input coupled to the input, and a second input coupled to the reference node;
    a second voltage controlled current source having a control terminal and to be coupled to the fist reference voltage and the output of the additional clamping circuit; and
    a second adding block having an output coupled to the control terminal of the second voltage controlled current source, a first input coupled to the reference node, and a second input.

24. The method according to claim 23, wherein the additional clamping circuit further comprises a first clamping block to be coupled to the reference node and the second reference voltage, and a second clamping block coupled to the reference node and the output of the additional clamping circuit; and wherein the output of the additional clamping circuit is coupled to the second input of the second adding block.

* * * * *

UNITED STATES PATENT AND TRADEMARK OFFICE
CERTIFICATE OF CORRECTION

PATENT NO. : 7,626,456 B2  Page 1 of 1
APPLICATION NO. : 12/121143
DATED : December 1, 2009
INVENTOR(S) : Calö et al.

It is certified that error appears in the above-identified patent and that said Letters Patent is hereby corrected as shown below:

Title page, item (*) Notice: should read as follows: Subject to any disclaimer, the term of this patent is extended or adjusted under 35 U.S.C. 154(b) by 41 days.

| | |
|---|---|
| Column 6, Line 28 | Delete: "internal,"<br>Insert: --internal-- |
| Column 7, Line 12 | Delete: "fist"<br>Insert: --first-- |
| Column 8, Line 4 | Delete: "a second"<br>Insert: --second-- |
| Column 10, Line 25 | Delete: "fist"<br>Insert: --first-- |

Signed and Sealed this

Fourteenth Day of September, 2010

David J. Kappos
*Director of the United States Patent and Trademark Office*